United States Patent [19]

Smith

[11] Patent Number: 5,291,025
[45] Date of Patent: Mar. 1, 1994

[54] IN-LINE NON-CONTACT WAFER BOAT INSPECTION APPARATUS

[75] Inventor: Michael D. Smith, Austin, Tex.

[73] Assignee: Advanced Micro Devices, Inc., Sunnyvale, Calif.

[21] Appl. No.: 982,791

[22] Filed: Nov. 30, 1992

[51] Int. Cl.$^5$ .................. G01N 21/86; H01J 3/14
[52] U.S. Cl. .................. 250/561; 250/237 G
[58] Field of Search .......... 250/560, 561, 571, 237 R, 250/237 G; 414/404, 416, 417; 211/41; 118/500

[56] References Cited

U.S. PATENT DOCUMENTS

| 4,568,234 | 2/1986 | Lee et al. | 414/404 |
| 4,572,101 | 2/1986 | Lee | 414/404 |
| 5,153,841 | 10/1982 | Goff et al. | 414/416 X |

OTHER PUBLICATIONS

Specification sheet for Series 3000 Non-Contact Measurement Systems, Pacific Precision Laboratories, Inc., Chatsworth, California, four (4) pages.
Brochure for Quartz Carriers, MGI Systems, A division of Micro Glass, Inc., eight (8) pages.

Primary Examiner—David C. Nelms
Assistant Examiner—John R. Lee
Attorney, Agent, or Firm—Skjerven, Morrill, MacPherson, Franklin & Friel

[57] ABSTRACT

An apparatus is disclosed for automatic optical inspection of a wafer boat having a plurality of parallel slotted side rods and bottom rods. A cradle holds the wafer boat in a stationary position. A separate optical sensor is mounted upon a carriage for each of the rods to be measured. Each of these sensors projects an optical beam toward the corresponding rod where, when longitudinally aligned within an individual slot, the beam is parallel to and substantially near the bottom of the slot. As the carriage is scanned from one end of the rods of the wafer boat to the other, the optical beam will be alternately obstructed by the rod or transmitted through a slot, thereby determining the slot edge locations of each of the slots in each of the rods in accordance with the position of the carriage. The slot widths and slot locations can then be determined from the slot edge locations. Additionally, the length of each of the bottom rods can be measured by reflecting an optical beam off of a flat surface of a clamp block positioned against the end of each of the bottom rods.

12 Claims, 5 Drawing Sheets

IN-LINE NON-CONTACT WAFER BOAT INSPECTION APPARATUS

BACKGROUND OF THE INVENTION

1. Field of the Invention

The present invention relates to the inspection of wafer boats utilized in a semiconductor wafer fabrication facility, and more specifically to an automatic apparatus for determining, in a non-contact fashion using optical sensors, whether certain mechanical dimensions of a wafer boat are within specification.

2. Description of Related Art

Slotted mass transfer wafer boats are used in semiconductor manufacturing for holding wafers during high temperature operations, such as an anneal operation performed in a furnace tube. These wafer boats are commonly constructed of a high-temperature quartz glass (hence the name "quartzware"), although polysilicon and silicon carbide materials are sometimes also used.

Figure 1:
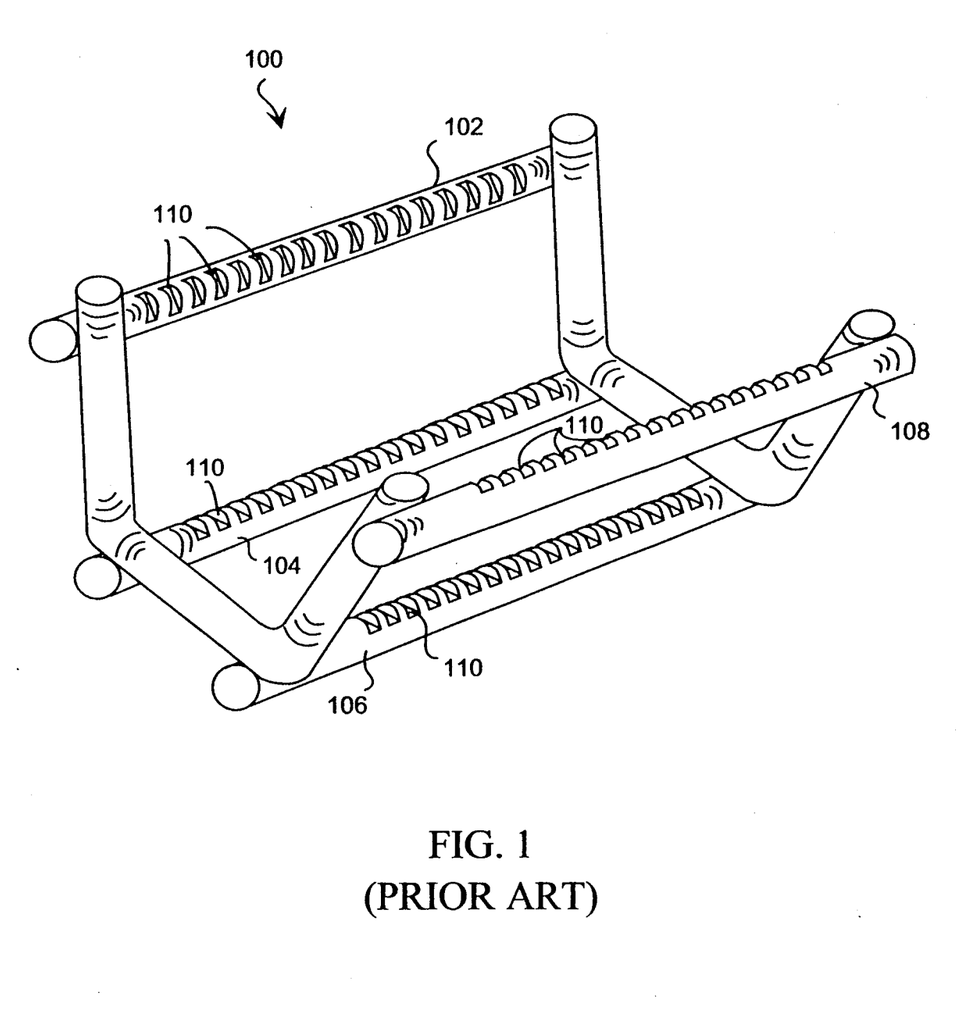
FIG. 1 is an isometric view of a quartzware wafer boat used in semiconductor wafer fabrication.

FIG. 1 shows a typical quartz wafer boat 100 which includes two bottom rods 104 and 106, and two side rods 102 and 108, each with a plurality of slots 110 on the inward side of each of the rods. The locations and size of the slots are such that a group of wafers may be positioned vertically in a horizontally positioned wafer boat and supported by their edges in the respective slots of the side and bottom rods.

To support a wafer, four slots are aligned in the same vertical plane. That is, a single slot from each of the two side rods and each of the two bottom rods define a single plane. The width of each slot is large enough to allow for clearance to easily insert a wafer into the slot, but should not be so large as to allow unnecessary lateral movement of the wafer once inserted. Excessive lateral movement of wafers dislodges contaminant particles that reduce the yields of wafers processed in the wafer boat. Furthermore, the slot-to-slot spacing along a given rod of the wafer boat is constant to permit the use of robotic loaders and unloaders which are programmed to adhere to a given wafer spacing. Wafer chipping and breakage can result if wafer boats are used that do not meet these specifications.

Even if a wafer boat is initially within specification, repetitive use can result in the wafer boat becoming out of specification. Repetitive heat cycling received by the wafer boat can cause sagging or warping of the horizontal rods. Additionally, cleaning operations typically remove a certain portion of the quartz material, resulting in slot enlargement over time.

Non-contact measurement systems do exist which are capable of measuring the slot width and slot locations in each of the rods. However, while very precise, most are general purpose optical measurement systems not well suited to inexpensively inspecting a wafer boat. Specifically, the measurement is slow and may involve many different equipment setups and a skilled operator, and the equipment itself is very expensive. Such equipment is more suitable for measuring calibration units, or so-called "golden units" due to the length of time needed to perform a measurement, as well as the cost. An example of this kind of measurement system is the Series 3000 Non-Contact Measurement System from Pacific Precision Laboratories, Inc.

Hence, the need remains in wafer fabrication facilities for an inexpensive apparatus that automatically and quickly determines whether wafer boats remain in specification after use, with a minimum of specialized operator training.

SUMMARY OF THE INVENTION

An advantage of the present invention for in-line screening in a wafer fabrication facility is to automatically and quickly measure all four rods of a wafer boat. The apparatus of the present invention is relatively inexpensive and requires no specialized operator training to use.

These advantages and others are obtained by an optical inspection apparatus, in accordance with the current invention, for automatic inspection of a wafer boat having a plurality of parallel slotted side rods and bottom rods. In one embodiment, a cradle for holding the wafer boat in a stationary position aligned to a frame is attached to the frame. A carriage is movably mounted upon the frame to permit linear motion of the carriage, and a plurality of optical sensors are mounted upon the carriage. A linear positioner mounted upon the frame is coupled to the carriage for moving the carriage in a direction parallel to the cradle so that when the carriage is moved with a wafer boat in the cradle, the sensors are moved along the side rods and bottom rods of the wafer boat so as to permit non-contact detection of the slot edges within each of the side rods and bottom rods. A first means is coupled to the linear positioner for controlling the position of the carriage.

In another embodiment, the apparatus contains optical means for determining the length of each of the bottom rods of the wafer boat.

DETAILED DESCRIPTION OF THE PREFERRED EMBODIMENTS

Figure 2:
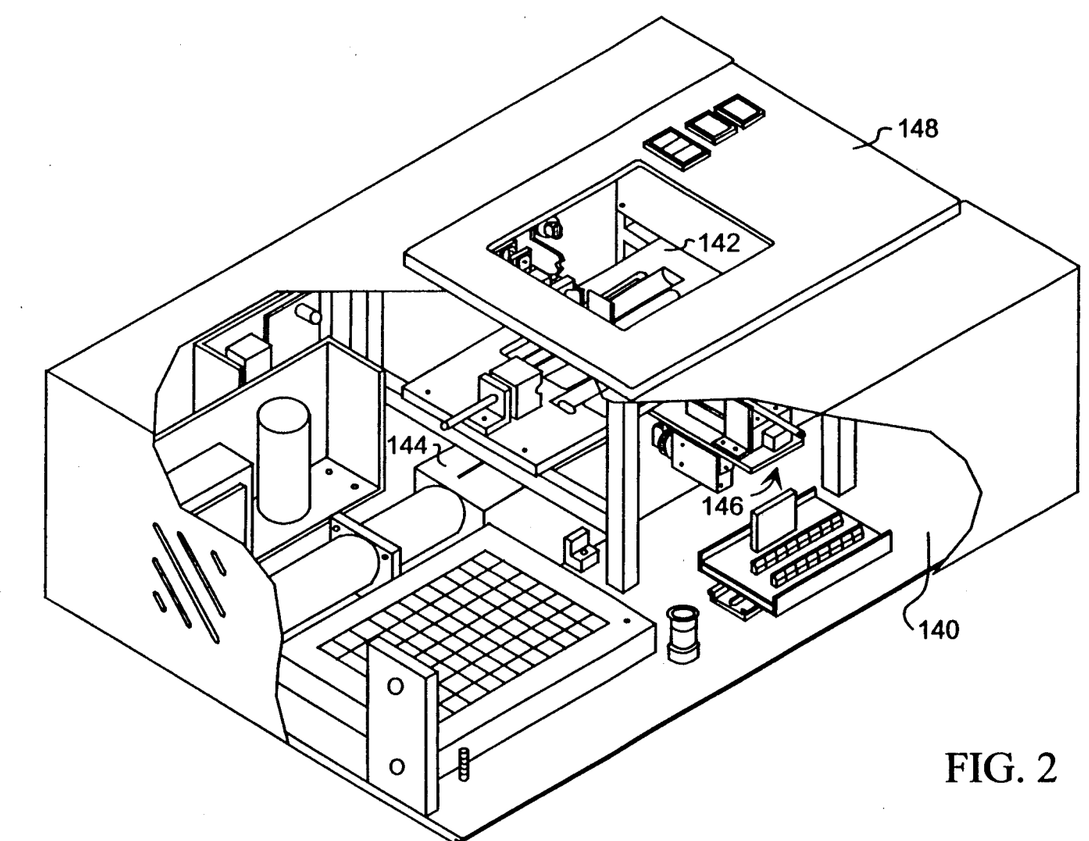
FIG. 2 is an isometric view of an automatic inspection apparatus in accordance with the present invention.

An automatic inspection apparatus in accordance with the present invention is shown in FIG. 2. A cradle 142 is attached to frame 140 in any suitable manner (e.g., by machine screws) and provides a stationary platform for holding a wafer boat such as the boat 100 (FIG. 1) in a known and fixed horizontal position. Top plate 148 includes an opening through which a wafer boat may be inserted from above into cradle 142 and likewise may be removed after inspection from above. A carriage 146 is mounted upon frame 140 (e.g., using linear shoe bearings) in such a manner as to be movable along a linear path. Linear positioner 144 is mounted on frame 140 and is connected to carriage 146 so as to cause linear motion of carriage 146. A group of optical sensors (not readily discernible in FIG. 2) are mounted upon carriage 146. The optical sensors scan the rods 102, 104, 106, and 108 of the wafer boat 100 as the carriage 146 is moved, sensing the edge locations of the slots 110 in each of the rods 102, 104, 106, and 108, as well as the length of the two bottom rods 104 and 106.

Figure 3:
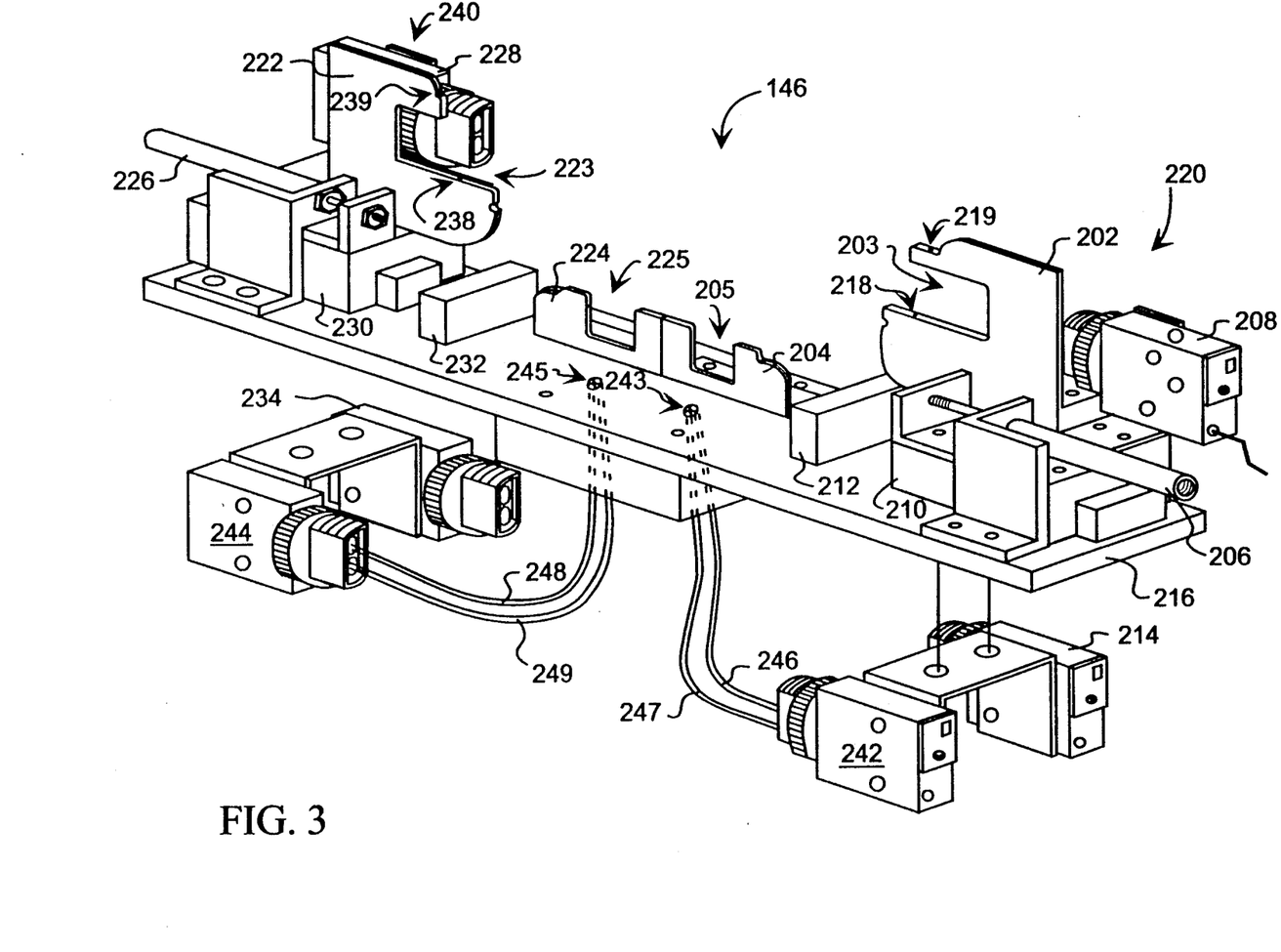
FIG. 3 is an isometric view of the carriage shown in FIG. 2, illustrating the details of the optical sensor arrangement.

FIG. 3 is an isometric view of carriage 146. Illustratively, an individual optical sensor includes a fiber bracket, an optical transceiver, a transmit fiber, and a receive fiber. As an example, optical sensor 220 includes fiber bracket 202 and optical transceiver 208 which are both mounted upon stage 210. For clarity, the transmit and receive fibers of sensor 220 are not shown in FIG. 3 and are described more fully referring to FIG. 4. Stage 210 is movably mounted upon beam 216 and is moved in a linear fashion by actuator 206. Movement stop 212 provides a reference point against which stage 210 will come to rest in an inward position. As can be seen in FIG. 3, fiber bracket 202 is a relatively thin bracket with a notch 203 formed between an upper arm and a lower arm of bracket 202. This notch 203 opens to the inward direction of carriage 146. An optical fiber (not shown) from the transmitter portion of the optical transceiver 208 is routed through a hole 218 formed within the lower arm of fiber bracket 202 and opening toward notch 203. A second hole 219 is formed within the upper arm of bracket 202 and is collinear with hole 218. A second fiber (not shown) is similarly routed through hole 219 and connects to the receiver portion of optical transceiver 208.

Optical sensor 240 is a mirror image of optical sensor 220 and is mounted identically with sensor 220 upon beam 216 at the end opposite sensor 220. Optical sensor 240 includes fiber bracket 222 and optical transceiver 228 which are both mounted upon stage 230. For clarity, the transmit and receive fibers of sensor 240 are not shown in FIG. 3 and are described more fully referring to FIGS. 4A, 4B, and 4C. Stage 230 is movably mounted upon beam 216 and is moved in a linear fashion by actuator 226. Movement stop 232 provides a reference point against which stage 230 will come to rest in an inward position. As can be seen in FIG. 3, fiber bracket 222 is a relatively thin bracket with a notch 223 formed between an upper arm and a lower arm of bracket 222. This notch 223 opens to the inward direction of carriage 146. An optical fiber (not shown) from the transmitter portion of the optical transceiver 228 is routed through a hole 238 formed within the lower arm of fiber bracket 222 and opening toward notch 223. A second hole 239 is formed within the upper arm of bracket 222 and is collinear with hole 238. A second fiber (not shown) is similarly routed through hole 239 and connects to the receiver portion of optical transceiver 228.

A third optical sensor includes fiber bracket 204, optical transceiver 214, a transmit fiber (not shown), and a receive fiber (not shown), while the fourth optical sensor includes fiber bracket 224, optical transceiver 234, a transmit fiber (not shown) and a receiver fiber (not shown). Fiber brackets 204 and 224 are similar to fiber bracket 202 except that notches 205 and 225 open upward rather than inward. Common to each of fiber brackets 202, 204, 222 and 224 is a notch (203, 205, 223, and 225, respectively) within which a respective rod (e.g., 108, 106, 102, and 104) of the wafer boat 100 is positioned without touching the interior edges of the fiber bracket which form the notch. Furthermore, collinear holes are formed on opposing arms of each bracket and serve as mounting holes for a transmitting fiber and a receiving fiber which are both coupled to corresponding optical transceivers 208, 214, 228, and 234.

Figure 4A:
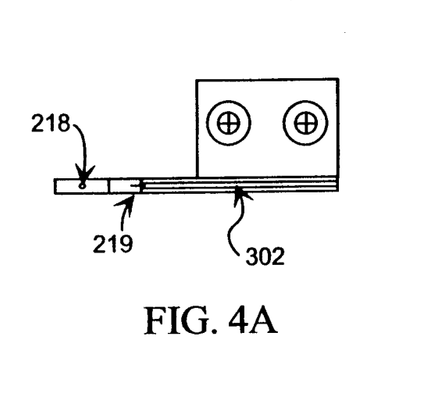
FIG. 4A is a top view illustration of a side fiber bracket to FIG. 3.
Figure 4B:
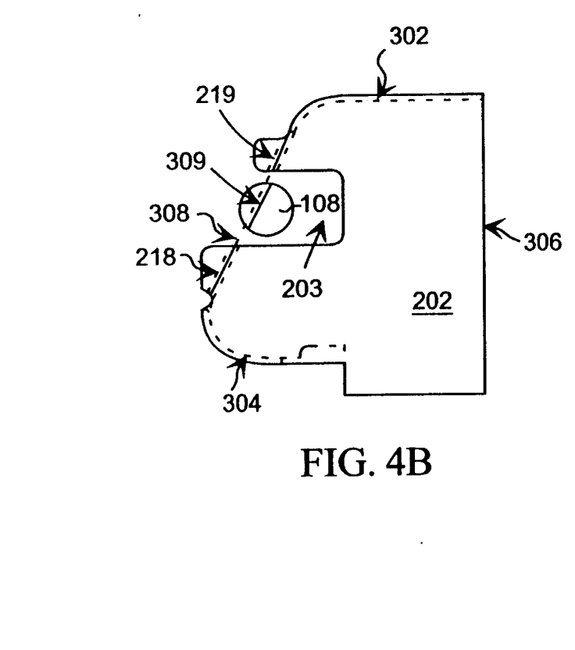
FIG. 4B is a front view of a side fiber bracket of FIG. 3.
Figures 4C, 5B:
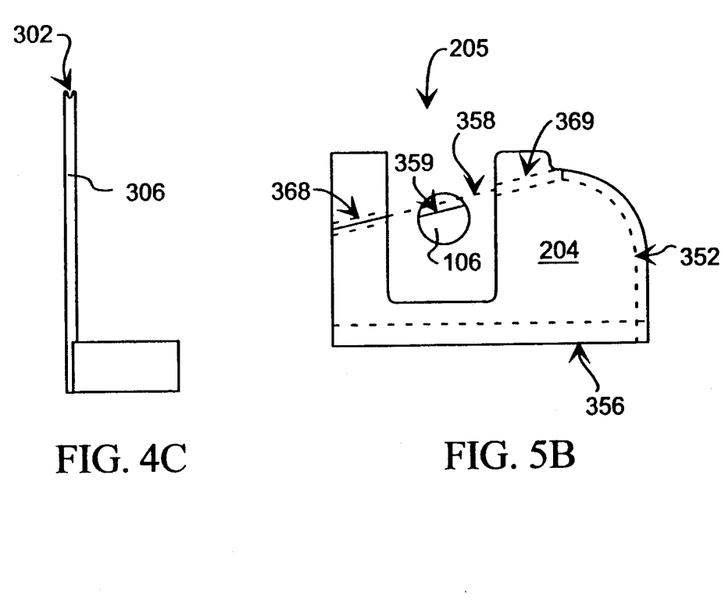
FIG. 4C is side view of a side fiber bracket of FIG. 3.
FIG. 5B is a front view of a bottom fiber bracket of FIG. 3.

FIG. 4A, 4B, and 4C provide additional detail of fiber bracket 202 (which is symmetric with fiber bracket 222, as can be seen from FIG. 3). Hole 219 is formed within the upper arm defining notch 203 of bracket 202, while collinear hole 218 is formed within the lower arm defining notch 203 of bracket 202. A transmit fiber (not shown) is routed through hole 218 and terminates substantially flush with notch 203. Channel 304 provides a convenient way to hold the transmit fiber against bracket 202 until it nears the back edge 306 of bracket 202, at which point the transmit fiber runs in free air and is connected to optical transceiver 208 (shown in FIG. 3). Similarly, a receive fiber (not shown) is routed through hole 219 and terminates substantially flush with notch 203. Channel 302 provides a convenient way to hold the receive fiber against bracket 202 until it reaches the back edge 306 of bracket 202, at which point the receive fiber runs in free air and is connected to optical transceiver 208 (shown in FIG. 3).

The alignment of collinear holes 218 and 219 provides for definition of an optical path 308 across notch 203 along which light emitted from a transmit fiber passes in order to be coupled into a receive fiber. In order to minimize the amount of light coupled into the receive fiber from directions other than along optical path 308, the end of the receive fiber may be positioned within hole 219 some internal distance from the edge of bracket 202 which defines notch 203. Also shown in FIG. 4B is a cross-section of a side rod such as, for example, rod 108, which shows the slot bottom 309 parallel to the optical path 308 from hole 218 to hole 219. The proper placement of collinear holes 218 and 219 within bracket 202 positions the optical path 308 well within the slot (when the carriage is suitably positioned) and parallel to the slot bottom 309.

Figure 5A:
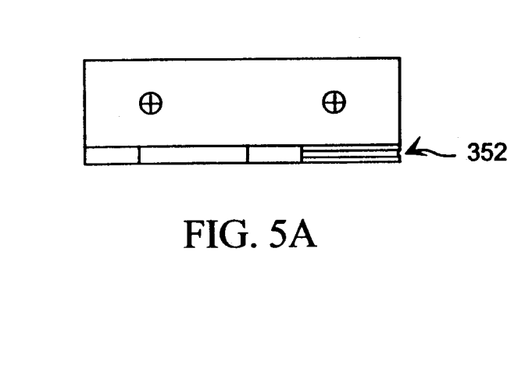
FIG. 5A is a top view illustration of a bottom fiber bracket of FIG. 3.
Figure 5C:
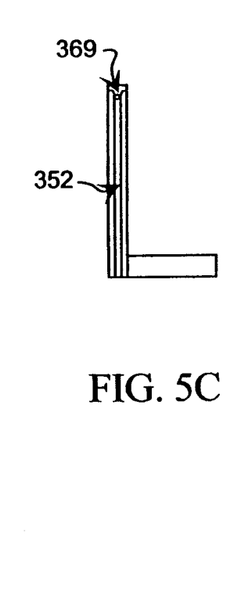
FIG. 5C is a side view of a bottom fiber bracket of FIG. 3.

FIG. 5A, 5B, and 5C provide additional detail of fiber bracket 204 (which is symmetric with fiber bracket 224, as can be seen from FIG. 3). Hole 369 is formed within the right arm defining notch 205 of bracket 204, while collinear hole 368 is formed within the left arm defining notch 205 of bracket 204. A transmit fiber (not shown) is routed 0 through hole 369 and terminates substantially flush with notch 205. Channel 352 provides a convenient way to hold the transmit fiber against bracket 204 until it reaches the bottom edge 356 of bracket 204, at which point the transmit fiber runs through beam 216 of carriage 146 and through free air and is connected to optical transceiver 214 (shown in FIG. 3). Similarly, a receive fiber (not shown) is routed through hole 368 and terminates substantially flush with notch 205. The receive fiber proceeds downward and runs through beam 216 of carriage 146 and through free air and is connected to optical transceiver 214 (shown in FIG. 3).

The alignment of collinear holes 368 and 369 provides for definition of an optical path 358 across notch 205 along which light emitted from a transmit fiber passes in order to be coupled into a receive fiber. In order to minimize the amount of light coupled into the receive fiber from directions other than along optical path 358, the end of the receive fiber may be positioned within hole 368 some internal distance from the edge of bracket 204 which defines notch 205. Also shown in FIG. 5B is a cross-section of a bottom rod such as, for example, rod 106, which shows a slot bottom 359 parallel to the optical path 358 from hole 368 to hole 369. The proper placement of collinear holes 368 and 369 within bracket 204 positions the optical path 358 well within the slot (when the carriage is suitably positioned) and parallel to the slot bottom 359. As can be seen, the angle of the optical path across the notch of the various fiber brackets is preferably determined by the angle at which the slots are cut into the various corresponding rods of the wafer boat.

Referring again to FIG. 3, actuators 206 and 226 cause the side optical sensors 220 and 240 to be moved inward after a wafer boat is inserted into cradle 142 from above. This is provided because the slots are cut on the inward side of the wafer boat side rods. The fiber brackets 202 and 222 position the transmit and receive fibers on the inward side of the rod to allow for the optical path across the notch to be able to detect the presence or absence of a slot. However, for the bottom rods, actuators for fiber brackets 204 and 224 are not needed because the wafer boat is loaded from above. As can be seen in FIG. 3, notches 205 and 225 open upwards on fixed fiber brackets 204 and 224 and allow for direct loading of the wafer boat from above.

When a wafer boat is inserted into cradle 142 and held in a stationary position, with side fiber brackets 202 and 222 in the inward positions, and as carriage 146 is scanned in a linear fashion along the length of the wafer boat, the beam of light emitted from the transmitting fiber of each of these fiber brackets will at times pass through a slot of the rod and be coupled into the receiving fiber and into the receiver portion of the respective optical transceiver. At other times the optical path from the transmitting fiber to the receiving fiber wil not be aligned with any slots of the rod, and the material of the rod itself will obstruct the beam and will cause a substantially smaller optical signal to be coupled into the receiving fiber. Thus, as the carriage 146 is scanned, the receiver outputs of the optical transceivers are monitored and indicate by a change in output signal the leading and trailing edges of each of the slots in each of the four rods 102, 104, 106, and 108 in the wafer boat 100. From this information, and from the position information of the carriage relative to a reference datum, the slot widths and slot locations (e.g., mid-points or other slot relational data) can be computed easily.

Further referring to FIG. 3, holes 243 and 245 are formed within beam 216 in locations directly below the bottom rods of an inserted wafer boat. Transmit fiber 246 is connected to the transmit portion of optical transceiver 242 and terminates substantially vertically within hole 243, substantially flush with the top surface of beam 216. Similarly, receive fiber 247 is connected to the receive portion of transceiver 242 and terminates adjacent to and parallel to transmit fiber 246 within hole 243, also substantially flush with the top surface of beam 216. These two fibers are arranged so as to permit light emitted upward from transmit fiber 246 to be coupled into receive fiber 247 if reflected downward by a flat surface or scattered by a material which may be above hole 243. Similarly, transmit fiber 248 is connected to the transmit portion of optical transceiver 244 and terminates substantially vertically within hole 245, substantially flush with the top surface of beam 216. Receive fiber 249 is connected to the receive portion of transceiver 244 and terminates adjacent to and parallel to transmit fiber 248 within hole 245, also substantially flush with the top surface of beam 216. These two fibers are arranged so as to permit light emitted upward from transmit fiber 248 to be coupled into receive fiber 249 if reflected downward by a flat surface or scattered by a material which may be above hole 245.

Figure 6:
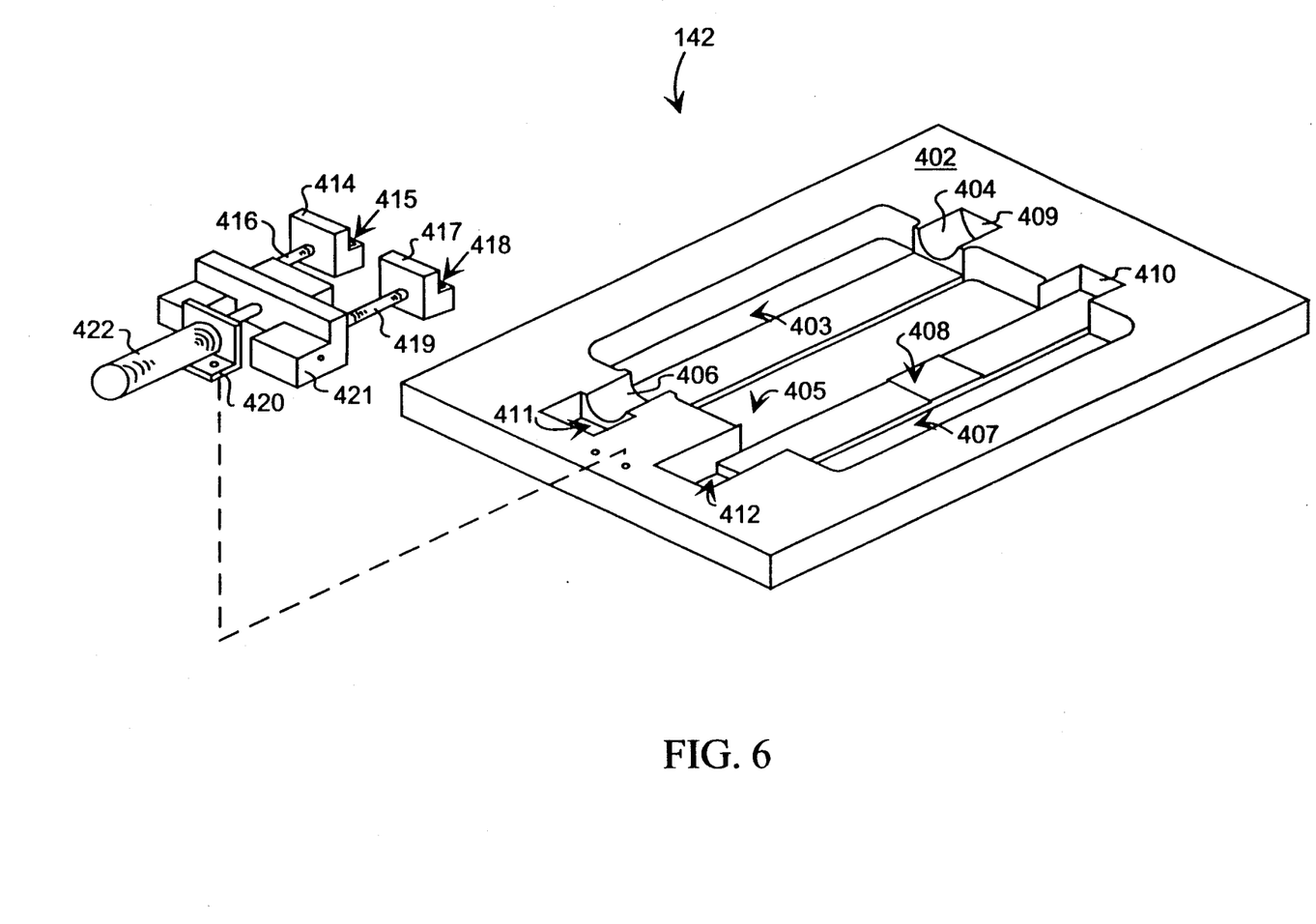
FIG. 6 is an isometric view of the cradle shown in FIG. 2, illustrating the features of the cradle useful to holding the wafer boat in a stationary position.

Further details of cradle 142 are illustrated in FIG. 6. In this embodiment, several features of the cradle are machined out of a single base 402. Semicircular supports 404 and 406 provide a support for both ends of one of the bottom rods (e.g., rod 104) of the wafer boat 100 and support surface 408 provides a support for the middle portion of the second bottom rod (e.g., rod 106). Supporting the wafer boat upon three non-collinear but coplanar supports provides for a stable resting position of the wafer boat even if the bottom rods of the wafer boat are non-coplanar or warped.

Clamp actuator 422 is mounted upon bracket 420 which is itself mounted upon base 402. Piston mount 421 is movably mounted upon base 402 and coupled to clamp actuator 422. Each of two clamp blocks 414 and 417 is coupled to piston mount 421 by respective spring-loaded pistons 416 and 419. Spring-loaded clamp blocks 414 and 417 provide lateral pressure upon one end of each of the bottom rods (for example, respective rods 104 and 106 of wafer boat 100) to cause the other end of each of the bottom rods of the wafer boat to be held firmly against opposing vertical reference walls 409 and 410. In this fashion, a wafer boat is firmly held in a stationary position upon cradle 142.

Slots 403, 405, and 407 are provided adjacent to both of the bottom rods of a wafer boat and allow for the protrusion of bottom fiber brackets 204 and 224 up through cradle 142 so that the optical path defined by brackets 204 and 224 are aligned with the slots of the bottom rods.

In operation, the wafer boat inspection apparatus first receives an inserted wafer boat. The wafer boat is inserted through the opening in top plate 148 from above by lowering the end of the wafer boat nearest clamp blocks 414 and 417 such that the ends of the bottom rods are aligned with and touching clamp blocks 414 and 417. The wafer boat is then moved in a lateral direction, compressing the spring-loaded pistons 416 and 419 until the opposite end of the bottom rods have achieved enough clearance to slide down inward of reference walls 409 and 410. At this point the wafer boat is lowered until resting upon supports 404, 406, and 408. The lateral pressure against spring-loaded clamp blocks 414 and 417 is gradually released to allow the wafer boat to be pressed up against reference walls 409 and 410 and firmly held in this stationary position. In another embodiment, the outward position of clamp blocks 414 and 417 is sufficiently retracted to allow a wafer boat to be directly inserted from above onto supports 404, 406 and 408, without having to apply any lateral force to clamp blocks 414 and 417. In yet another embodiment, the cradle could be mounted at a sufficiently steep angle (e.g., 30°–45°) to cause a wafer boat to rest firmly against reference walls 409 and 410 without requiring any clamp blocks 414 and 417.

To enhance the automation of this test procedure, a very simple operator interface, typically including a start test button, preferably is provided. Once initiated, all test functions are controlled and sequenced by an on-board controller, such as, for example, a suitably programmed microcomputer based upon the Am386 TM microprocessor, sold by Advanced Micro Devices, Inc. of Sunnyvale, Calif. After test initiation, the controller first causes clamp actuator 422 to move piston mount 421 to the inward test position, thereby firmly holding the wafer boat in the cradle. Next, referring to FIG. 3, the controller causes the sensor actuators 206 and 226 to move optical sensors 220 and 240 from their initially retracted or outward position to a second position in the inward direction of the wafer boat, at rest against movement stops 212 and 232, thus properly positioning fiber brackets 202 and 222 to be in proper alignment with the slots of the side rods 108 and 102. The carriage 146 is then scanned from one end of the wafer boat to the other end. As this scanning takes place, the controller monitors the receive outputs of all four of the optical transceivers and senses the leading and trailing slot edges in each of the four rods.

In one embodiment, this is accomplished by utilizing a linear positioner having a stepper motor driving a lead screw, such that each step of the stepper motor corresponds to a unique and known position of the carriage 146. As the stepper motor scans the carriage from one end of the rods to the other, each of the optical receivers is sampled at each step position to determine whether the optical path across the respective notches in each of the fiber brackets is either obstructed by the material of each of the rods, or is unobstructed indicating the presence of a slot. These sampled data points are loaded into four linear data arrays in real time as the carriage 146 is scanned and retreived later for subsequent analysis and measurement reporting.

Alternative mechanisms may be used to move the carriage 146. Any mechanism which is controllable to an incremental displacement substantially smaller than the dimension of the slots being measured will provide good results. For example, a linear induction motor might be used. Furthermore, a linear encoder might be used to convey positional information about the location of carriage 146 relative to cradle 142.

Because of the mechanical variations and construction of each of the fiber brackets 202, 204, 222, and 224 and the alignment variations of the mounting of each of these four fiber brackets upon beam 216, a calibration capability is desirable so as to not require exceedingly tight tolerances in the manufacturing precision of the wafer boat inspection apparatus. This can be easily achieved by using a known reference standard wafer boat which may be measured by analytical instrumentation and which is sometimes known as a "golden unit".

In one "golden unit" method, a "golden unit" wafer boat is placed in the wafer boat inspection apparatus, a scan is performed, and the four linear data arrays are loaded with the measured results. The measured data arrays are compared with reference data arrays determined from the analytical instrumentation measurement of the golden unit wafer boat. Differences between each of the four measured data arrays and the four reference data arrays, and the known specification of the golden unit, are utilized to compute offset co-efficients for each data array necessary to nullify any actual misalignment of the optical sensor for the respective rod of the wafer boat corresponding to each data array. Additionally, any nonlinearities in the linear positioner that would affect all four of the data arrays is compensated for.

Having the data of all four rods in each of four linear data arrays also provides for analytical algorithms to compute the coplanarity of the respective slots in each of the four rods to ensure that a wafer placed within a given slot location corresponding to all four rods would be at minimal risk of chipping along the edge due to any misaligned slots among the four supporting rods. A variety of suitable mathematical algorithms are known.

In operation, the wafer boat inspection apparatus also determines the lengths of the two bottom rods 104 and 106 of the wafer boat 100 under automatic control. Optical transceivers 244 and 242 (of FIG. 3) are utilized to measure the length of the two bottom rods of the wafer boat by directing a light source upwards through each of holes 245 and 243 of beam 216 toward cradle 142. Referring to FIG. 6, these light beams pass through respective openings 411 and 412 in the cradle 142 and are directed toward the curved bottom surface of respective bottom rods 104 and 106. As the carriage 146 is moved, the light beam directed toward the bottom rods is positioned beyond the extent of the bottom rods and is directed toward respective spring-loaded clamp blocks 414 and 417 of cradle 142. The contrast between the reflected light from the bottom surface of clamp blocks 414 and 417 and from the light (or lack thereof) reflected from holes 415 and 418 within respective clamp blocks 414 and 417 is easily discerned by the optical receiver portions of respective optical transceivers 244 and 242, and thus can be used to determine the length of the bottom two rods 104 and 106 of the wafer boat 100. Since the vertical faces of clamp blocks 414 and 417 which press laterally on the bottom rods are flat vertical surfaces, the clamp blocks each contact the end of a bottom rod at the furthest extent of that rod's length. Even if the end of a rod is rounded, the measured length will correspond to the longest dimension of the rod, and not the length of the rod as might be perceived only at the bottom curved surface.

The calibration used for this method is similarly provided for by measuring a known golden unit and determining the appropriate offset coefficients to establish a reference datum corresponding to reference walls 409 and 410 of cradle 142.

The embodiments described above are illustrative, and the invention is not necessarily limited thereto. For instance, in one variation, the optical transceivers are implemented with Light-Emitting-Diodes (LED's) or with lasers. Furthermore, while a low-cost microprocessor-based controller is a good choice for a control device, a wide variety of other controller mechanisms could be utilized with acceptable results. In an alternate embodiment, the carriage 146 could be mounted to frame 140 and remain stationary with frame 140, and the cradle 142 mounted to move in a linear fashion using a suitable mechanism. Furthermore, while described in the preferred embodiment as having four optical sensors to each measure one of the four rods of a wafer boat, other embodiments could easily accommodate wafer boats with more or less than four rods. Accordingly, other embodiments, variations, and improvements not described herein are not necessarily excluded from the scope of the invention, which is defined by the following claims.

I claim:

1. An apparatus for automatic optical inspection of a wafer boat having a plurality of parallel slotted side rods and bottom rods, comprising:

a frame;

a cradle attached to the frame for supporting a wafer boat in a stationary position aligned to the frame;

a carriage movably mounted upon the frame to permit linear motion of the carriage;

a plurality of optical sensors mounted upon the carriage;

a linear positioner mounted upon the frame and coupled to the carriage for moving the carriage in a direction parallel to the cradle so that when the carriage is moved with a wafer boat in the cradle, the optical sensors are moved along the side rods and bottom rods of the wafer boat so as to permit non-contact detection of the slot edges within each of the side rods and bottom rods; and means coupled to the linear positioner for controlling the position of the carriage.

2. An apparatus as in claim 1, further comprising optical means for determining the length of each of the bottom rods.

3. An apparatus for automatic optical inspection of a wafer boat having a plurality of parallel slotted side rods and bottom rods, comprising:

a frame;

a cradle attached to the frame for supporting a wafer boat in a stationary horizontal position aligned to the frame;

a carriage movably mounted upon the frame to permit linear motion of the carriage;

a linear positioner mounted upon the frame and coupled to the carriage for moving the carriage in a direction parallel to the cradle;

a plurality of first optical sensors mounted upon the carriage and projecting through the cradle so that when a wafer boat is supported in the cradle, each of the first optical sensors is in close proximity to a corresponding bottom rod of the wafer boat so as to permit non-contact detection of the slot edges within the corresponding bottom rod as the carriage is moved;

a plurality of second optical sensors movably mounted upon the carriage, each positionable into either of first and second positions relative to the cradle, the first position being an operating position so that when a wafer boat is supported in the cradle, each of the second optical sensors is in close proximity to a corresponding side rod of the wafer boat so as to permit non-contact detection of the slot edges within the corresponding side rod as the carriage is moved, and the second position being a retracted position so that when a wafer boat is supported in the cradle, the second optical sensors are remote from the corresponding side rod in an outward direction to allow for removal of the wafer boat from the cradle;

a plurality of actuators mounted upon the carriage and respectively coupled to the second optical sensors for moving the second optical sensors between their respective second and first positions;

means coupled to each of the actuators for controlling the position of the second optical sensors; and means coupled to the linear positioner for controlling the position of the carriage.

4. An apparatus as in claim 3, wherein each of the first and second optical sensors comprises:

a bracket having a notch between a first arm and a second arm of the bracket, the notch being of a size and shape so that a corresponding rod of the wafer boat may be positioned substantially within the notch without contacting the bracket, the bracket further having opposing first and second holes through the corresponding first and second arms of the bracket;

a first optical fiber passing through the first hole, having a first end substantially coincident with the notch, and a second end;

a second optical fiber passing through the second hole, having a first end substantially coincident with the notch, and a second end;

optical transmitter means coupled to the second end of the first optical fiber for coupling an optical signal into the first optical fiber, the first end of the first optical fiber and the first end of the second optical fiber being disposed relative to one another so that the optical signal is emitted at the first end of the first fiber and at least a portion thereof is directed across the notch in a direction in-line with the first and second holes and toward the first end of the second optical fiber; and optical receiver means coupled to the second end of the second fiber for converting an optical signal in the second optical fiber into a corresponding electrical signal.

5. An apparatus as in claim 4, wherein the cradle compriese:

a base having slotted openings on either side of each of the bottom rods for permitting the brackets of the first optical sensors to protrude up through the base on either side of each of the bottom rods;

first and second supports attached to the base and having a generally semi-circular shape for supporting regions near the ends of a first bottom rod;

a third support attached to the base, for supporting a region near the center of a second bottom rod;

a reference wall formed by a vertical surface at a first end of the base adjacent to and outward of the first support, the reference wall being perpendicular to the longitudinal direction of the bottom rods, for lateral alignment of the wafer boat within the cradle; and a plurality of spring-loaded clamp blocks movably mounted on a second end of the base opposite the reference wall, for holding the wafer boat firmly in the cradle by applying respectively a longitudinal force to the bottom rods at respective ends thereof, and causing opposite ends of the bottom rods to be pressed towards and held against the reference wall.

6. An apparatus as in claim 5, further comprising a plurality of third optical sensors mounted on the carriage for determining respectively the length of the bottom rods, wherein each of the third optical sensors comprises:

a third optical fiber having a first end attached to the carriage at a location so that when the carriage is moved to a position proximate the clamp blocks, the first end of the third optical fiber is proximate to and below the clamp block associated with the corresponding bottom rod, the third optical fiber further having a second end;

a fourth optical fiber having a first end attached to the carriage substantially adjacent to the location of the first end of the third optical fiber, the fourth optical fiber further having a second end;

optical transmitter means coupled to the second end of the third optical fiber for coupling a first optical signal into the third optical fiber so that the first optical signal is emitted at the first end of the third optical fiber; and optical receiver means coupled to the second end of the fourth optical fiber for converting a second optical signal in the fourth optical fiber into a corresponding electrical signal, the second optical signal being a reflection of the first optical signal by the clamp block.

7. An apparatus as in claim 6, wherein each of the clamp blocks further comprises a flat reflective bottom surface, further having a hole formed therethrough intersecting the flat reflective bottom surface at a location so as to be alignable over the first end of the corresponding third optical fiber as the carriage is moved, for providing a high contrast reflected second optical signal in the corresponding fourth optical fiber so as to easily determine the position of the corresponding clamp block relative to the reference wall of the cradle.

8. An apparatus for automatic optical inspection of a wafer boat having parallel slotted first and second side rods and first and second bottom rods, comprising:

a frame;

a cradle attached to the frame for supporting a wafer boat in a stationary horizontal position aligned to the frame;

a carriage movably mounted upon the frame to permit linear motion of the carriage;

a linear positioner mounted upon the frame and coupled to the carriage for moving the carriage in a direction parallel to the cradle;

a first stage movably mounted upon the carriage, being positionable into either of first and second positions;

a first actuator mounted upon the carriage and coupled to the first stage, for moving the first stage between the first and second positions;

a first optical sensor mounted upon the first stage, the first position of the first stage being an operating position so that when a wafer boat is supported in the cradle, the first optical sensor is in close proximity to the first side rod of the wafer boat so as to permit non-contact detection of the slot edges within the first side rod as the carriage is moved, and the second position of the first stage being a retracted position so that when a wafer boat is supported in the cradle, the first optical sensor is remote from the first side rod in an outward direction to allow for removal of the wafer boat from the cradle;

a second stage movably mounted upon the carriage, being positionable into first and second positions;

a second actuator mounted upon the carriage and coupled to the second stage, for moving the second stage between the first and second positions;

a second optical sensor mounted upon the second stage, the first position of the second stage being an operating position so that when a wafer boat is supported in the cradle, the second optical sensor is in close proximity to the second side rod of the wafer boat so as to permit non-contact detection of the slot edges within the second side rod as the carriage is moved, and the second position of the second stage being a retracted position so that when a wafer boat is supported in the cradle, the second optical sensor is remote from the second side rod in an outward direction to allow for removal of the wafer boat from the cradle;

a third optical sensor fixably mounted upon the carriage, so that when a wafer boat is supported in the cradle, the third optical sensor is in close proximity to the first bottom rod of the wafer boat so as to permit non-contact detection of the slot edges within the first bottom rod as the carriage is moved;

a fourth optical sensor fixably mounted upon the carriage, so that when a wafer boat is supported in the cradle, the fourth optical sensor is in close proximity to the second bottom rod of the wafer boat so as to permit non-contact detection of the slot edges within the second bottom rod as the carriage is moved;

means coupled to the first and second actuators for controlling the position of the first and second optical sensors;

means coupled to the linear positioner for controlling the position of the carriage; and means coupled to the first, second, third, and fourth optical sensors for determining the slot edge locations within the respective first side rod, second side rod, first bottom rod, and second bottom rod, in accordance with the position of the carriage.

9. An apparatus as in claim 8, wherein the first, second, third, and fourth optical sensors each comprises:

a bracket having a notch between a first arm and a second arm of the bracket, the notch being of a size and shape so that a corresponding rod of the wafer boat may be positioned substantially within the notch without contacting the bracket, the bracket further having opposing first and second holes through the corresponding first and second arms of the bracket;

a first optical fiber passing through the first hole, having a first end substantially coincident with the notch, and a second end;

a second optical fiber passing through the second hole, having a first end substantially coincident with the notch, and a second end;

first optical transmitter means coupled to the second end of the first optical fiber for coupling a first optical signal into the first optical fiber, the first end of the first optical fiber and the first end of the second optical fiber being disposed relative to one another so that the first optical signal is emitted at the first end of the first optical fiber and at least a portion thereof is directed along an optical path across the notch in a direction in-line with the first and second holes and toward the first end of the second optical fiber; and first optical receiver means coupled to the second end of the second optical fiber for converting a second optical signal in the second optical fiber into a corresponding electrical signal.

10. An apparatus as in claim 9, wherein the cradle comprises:

a base having slotted openings on either side of each of the bottom rods for permitting the brackets of the third and fourth optical sensors to protrude up through the base on either side of each of the bottom rods;

first and second supports attached to the base and having a generally semi-circular shape for supporting regions near the ends of the first bottom rod;

a third support attached to the base, for supporting a region near the center of the second bottom rod;

first and second reference walls each formed by a vertical surface at a first end of the base outward of the first support, the first and second reference walls being coplanar and perpendicular to the longitudinal direction of the bottom rods, for lateral alignment of the wafer boat within the cradle; and first and second spring-loaded clamp blocks movably mounted on a second end of the base opposite the first and second reference walls, for holding the wafer boat firmly in the cradle by applying respectively a longitudinal force to respective first and second bottom rods at respective ends thereof and causing opposite ends of respective first and second bottom rods to be pressed towards and held against respective first and second reference walls.

11. An apparatus as in claim 10, further comprising means for determining the length of the first and second bottom rods, said means comprising:

a third optical fiber having a first end substantially vertically attached to the carriage at a location so that when the carriage is moved to a position proximate the clamp blocks, the first end of the third optical fiber is proximate to and below the first clamp block, the third optical fiber further having a second end;

a fourth optical fiber having a first end attached to the carriage substantially adjacent to and parallel to the first end of the third optical fiber, the fourth optical fiber further having a second end;

second optical transmitter means coupled to the second end of the third optical fiber for coupling a third optical signal into the third optical fiber so that the third optical signal is emitted at the first end of the third optical fiber and directed upward toward the first clamp block;

second optical receiver means coupled to the second end of the fourth optical fiber for converting a fourth optical signal in the fourth optical fiber into a corresponding electrical signal, the fourth optical signal being a reflection of the emitted third optical signal by the first clamp block;

a fifth optical fiber having a first end substantially vertically attached to the carriage at a location so that when the carriage is moved to a position proximate the clamp blocks, the first end of the third optical fiber is proximate to and below the second clamp block, the fifth optical fiber further having a second end;

a sixth optical fiber having a first end attached to the carriage substantially adjacent to and parallel to the first end of the fifth optical fiber, the sixth optical fiber further having a second end;

third optical transmitter means coupled to the second end of the fifth optical fiber for coupling a fifth optical signal into the fifth optical fiber so that the fifth optical signal is emitted at the first end of the fifth optical fiber and directed upward toward the second clamp block; and third optical receiver means coupled to the second end of the sixth optical fiber for converting a sixth optical signal in the sixth optical fiber into a corresponding electrical signal, the sixth optical signal being a reflection of the emitted fifth optical signal by the second clamp block.

12. An apparatus as in claim 11, wherein the first and second clamp blocks each further comprises a flat reflective bottom surface, further having a hole formed therethrough intersecting the flat reflective bottom surface at a location so as to be alignable over the first ends of the respective third and fifth optical fibers as the carriage is moved, for providing a high contrast reflected fourth and sixth optical signals, respectively, so as to easily determine the position of the respective first and second clamp blocks relative to respective first and second reference walls of the cradle.

* * * * *

UNITED STATES PATENT AND TRADEMARK OFFICE
CERTIFICATE OF CORRECTION

PATENT NO.    :  5,291,025
DATED         :  March 1, 1994
INVENTOR(S)   :  Michael D. Smith It is certified that error appears in the above-identified patent and that said Letters Patent is hereby corrected as shown below:

Column 4, line 50, delete "O".

Column 10, line 24, Claim 5, delete "compriese" and insert --comprises--.

Signed and Sealed this

Sixth Day of December, 1994

Attest:

BRUCE LEHMAN

*Attesting Officer*   *Commissioner of Patents and Trademarks*